US012334680B2

(12) United States Patent
Morgan et al.

(10) Patent No.: US 12,334,680 B2
(45) Date of Patent: Jun. 17, 2025

(54) CIRCUIT BOARD ASSEMBLY FOR A COMMUNICATION SYSTEM

(71) Applicant: TE Connectivity Solutions GmbH, Schaffhausen (CH)

(72) Inventors: Chad William Morgan, Carneys Point, NJ (US); John Joseph Consoli, Harrisburg, PA (US); Timothy Robert Minnick, Enola, PA (US); Justin Dennis Pickel, Hummelstown, PA (US); Douglas Edward Shirk, Elizabethtown, PA (US); David Allison Trout, Lancaster, PA (US); Michael Streckewald, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 0 days.

(21) Appl. No.: 18/617,564

(22) Filed: Mar. 26, 2024

(65) Prior Publication Data

US 2024/0235116 A1 Jul. 11, 2024

Related U.S. Application Data

(63) Continuation of application No. 17/404,089, filed on Aug. 17, 2021, now Pat. No. 11,949,189.

(51) Int. Cl.
*H01R 13/631* (2006.01)
*H01R 12/72* (2011.01)
(Continued)

(52) U.S. Cl.
CPC ....... *H01R 13/6315* (2013.01); *H01R 12/727* (2013.01); *H01R 12/737* (2013.01);
(Continued)

(58) Field of Classification Search
CPC ...... H05K 5/006; H05K 7/1402; H05K 7/183; H01R 12/91; H01R 12/727; H01R 12/75; H01R 12/737; H01R 12/722; H01R 12/712; H01R 13/18; H01R 13/6315; H01R 2107/00; H01R 2201/04; H01R 24/20; H01R 24/28
(Continued)

(56) References Cited

U.S. PATENT DOCUMENTS 3,129,991 A * 4/1964 Schmitz ................. H01R 12/73
439/945
3,651,444 A * 3/1972 Desso ................ H01R 13/4538
439/680
(Continued)

*Primary Examiner* — Marcus E Harcum

(57) ABSTRACT

A circuit board assembly includes a circuit board and an electrical connector having a connector housing holding contacts in a contact array. The connector housing has a mating end configured to be mated with a mating electrical connector in a mating direction. The electrical connector has cables terminated to the contacts and extending from a cable end. A connector mount is used to locate the electrical connector relative to the circuit board. A bracket is coupled to the mounting surface of the circuit board. A biasing member is coupled to the bracket and the mounting feature and is compressible along a compression axis parallel to the mating direction to allow the electrical connector to float in the mating direction relative to the circuit board.

17 Claims, 6 Drawing Sheets

(51) Int. Cl.
  *H01R 12/73* (2011.01)
  *H01R 12/75* (2011.01)
  *H01R 13/18* (2006.01)
  *H05K 5/00* (2006.01)
  *H01R 107/00* (2006.01)

(52) U.S. Cl.
  CPC ............ *H01R 12/75* (2013.01); *H01R 13/18* (2013.01); *H05K 5/006* (2013.01); *H01R 2107/00* (2013.01); *H01R 2201/04* (2013.01)

(58) Field of Classification Search
  USPC ........................................ 439/362, 246, 247
  See application file for complete search history.

(56) References Cited

U.S. PATENT DOCUMENTS

| | | | | |
|---|---|---|---|---|
| 4,487,466 A * | 12/1984 | Petit | ........................ | H01R 29/00 439/516 |
| 4,906,197 A * | 3/1990 | Noll | ...................... | G02B 6/3817 439/364 |
| 5,271,286 A * | 12/1993 | Vranish | ................... | H01R 43/26 244/173.1 |
| 5,291,368 A * | 3/1994 | Conroy-Wass | ........ | H05K 7/183 361/730 |
| 5,383,790 A * | 1/1995 | Kerek | ................... | H01R 13/635 439/248 |
| 6,261,122 B1 * | 7/2001 | Richter | .............. | H01R 13/6315 439/477 |
| 6,364,536 B1 * | 4/2002 | Chen | ................. | H01R 13/6315 439/246 |
| 6,422,885 B2 * | 7/2002 | Kain | .................. | H01R 13/6315 439/247 |
| 6,851,980 B2 * | 2/2005 | Nelson | ................. | H01R 13/518 439/246 |
| 7,168,978 B1 * | 1/2007 | Trout | ................... | H01R 13/743 439/545 |
| 7,393,228 B2 * | 7/2008 | Kabasawa | ............... | F04D 19/04 439/247 |
| 7,549,885 B1 * | 6/2009 | Oh | ..................... | H01R 13/6215 439/316 |
| 7,704,077 B1 * | 4/2010 | Morley | .................. | H01R 24/50 439/63 |
| 8,231,399 B2 * | 7/2012 | Daubigney | ........ | H01R 13/6275 439/316 |
| 8,366,468 B2 * | 2/2013 | Carnevali | ............ | G06F 1/1632 439/384 |
| 8,894,431 B2 * | 11/2014 | Tiberghien | ......... | H01R 13/6315 439/247 |
| 9,270,052 B1 * | 2/2016 | Martin | ............... | H01R 13/6315 |
| 9,730,357 B2 * | 8/2017 | Simpson | ............. | H05K 7/1492 |
| 9,843,140 B1 * | 12/2017 | Rossman | ............... | H01R 12/91 |
| 10,103,462 B2 * | 10/2018 | Herring | ................ | H01R 12/737 |
| 10,177,483 B1 * | 1/2019 | Horning | ............. | H01R 13/6473 |
| 10,224,652 B2 * | 3/2019 | Herring | ............... | H01R 12/737 |
| 10,297,963 B2 * | 5/2019 | Herring | .................. | H01R 27/02 |
| 10,320,134 B2 * | 6/2019 | Blackburn | ......... | H01R 13/6587 |
| 10,446,959 B2 * | 10/2019 | Groom | ................ | H01R 13/518 |
| 10,558,000 B2 * | 2/2020 | Miller | ..................... | H01R 24/40 |
| 10,622,761 B1 * | 4/2020 | Held | .................. | H01R 13/6315 |
| 10,811,798 B2 * | 10/2020 | Rossman | ............... | H01R 12/91 |
| 11,949,189 B2 * | 4/2024 | Morgan | ............... | H05K 7/1454 |
| 2001/0002344 A1 * | 5/2001 | Yokoi | .................. | H01R 13/748 439/246 |
| 2002/0001985 A1* | 1/2002 | Saito | ................ | H01R 13/62905 439/246 |
| 2003/0077932 A1* | 4/2003 | Lewinnek | .......... | H01R 13/6315 439/246 |
| 2004/0180568 A1* | 9/2004 | Wu | .................... | H01R 13/6215 439/362 |
| 2006/0105603 A1* | 5/2006 | Nishio | .............. | H01R 13/6315 439/247 |
| 2006/0141836 A1* | 6/2006 | Van Der Mee | .... | H01R 13/6315 439/247 |
| 2008/0026622 A1* | 1/2008 | Tomizu | .............. | H01R 13/6315 439/247 |
| 2009/0068870 A1* | 3/2009 | Mezhinsky | .......... | G02B 6/3882 439/247 |
| 2015/0071675 A1* | 3/2015 | Suzaki | ................... | G03G 15/80 439/247 |
| 2016/0276790 A1* | 9/2016 | Simpson | ............ | H01R 13/6315 |
| 2017/0257980 A1* | 9/2017 | Fukunaga | ............... | F16L 37/40 |
| 2020/0153135 A1* | 5/2020 | Rossman | ............... | H01R 12/722 |
| 2020/0227851 A1* | 7/2020 | Do | ......................... | H01R 12/75 |

\* cited by examiner

CIRCUIT BOARD ASSEMBLY FOR A COMMUNICATION SYSTEM

CROSS REFERENCE TO RELATED APPLICATIONS

This application is a continuation of and claims benefit to U.S. application Ser. No. 17/404,089, filed 17 Aug. 2021, titled CIRCUIT BOARD ASSEMBLY FOR A COMMUNICATION SYSTEM, the subject matter of which is herein incorporated by reference in its entirety.

BACKGROUND OF THE INVENTION

The subject matter herein relates generally to communication systems.

Communication systems use electrical connectors to electrically connect various components to allow data communication between the components. For example, in a backplane system, circuit board assemblies having electrical connectors mounted to circuit boards are mated to electrically connect the circuit boards. The system may include an equipment rack used to support the circuit board assemblies relative to each other. Known rack mount circuit board backplane connectors typically need to absorb large dimensional tolerance accumulation of the relative distance between the circuit boards inserted from both sides of the equipment rack. Typical tolerance distances may be 1.5 mm or more. The contacts of the backplane connectors at the mating zone are sized to accommodate the circuit board mating tolerance distances. For example, the lengths of the contacts include the lengths required for mechanical mating and any designed contact wipe length plus the additional circuit board mating tolerance distance. The contacts have such length to accommodate the possible range of circuit board mating conditions. The additional length of the contacts is typically provided as an extension of the stub of the contact, which is the portion of the contact that extends past the mating point, to ensure that the contacts remain mated regardless of the circuit board positions. In high speed connectors, the stubs can significantly degrade the signal integrity performance of the connector. The electrical stub acts as a reflective element for energy that travels along the stub. When the energy travels back at certain combinations of signal wavelength (for example, frequency) and physical stub length, the stub can generate a null in transmitted energy at a specific frequency. When the stub is long enough, and the respective frequency low enough, the null is detrimental to the transmitted energy of the signal that reaches the receiver.

A need remains for electrical connectors of a communication system having short contact lengths for improved signal integrity performance.

BRIEF DESCRIPTION OF THE INVENTION

In one embodiment, a circuit board assembly is provided and includes a circuit board having a mounting surface. The circuit board has a mating edge and side edges extending from the mating edge to a rear edge. The circuit board has a board guide feature for locating the circuit board in an equipment rack. The circuit board includes an electrical connector having a connector housing holding contacts in a contact array. The connector housing has a mating end and a cable end. The mating end is configured to be mated with a mating electrical connector in a mating direction. The electrical connector has cables terminated to the contacts and extending from the cable end. The connector housing has a mounting feature. The circuit board includes a connector mount for locating the electrical connector relative to the circuit board. The connector mount has a bracket coupled to the mounting surface of the circuit board proximate to the mating edge. The connector mount has a biasing member coupled to the bracket and coupled to the mounting feature of the electrical connector. The biasing member is compressible along a compression axis parallel to the mating direction to allow the electrical connector to float in the mating direction relative to the circuit board.

In another embodiment, a communication system is provided and includes a first circuit board assembly including a first circuit board, a first connector mount coupled to the first circuit board, and a first electrical connector coupled to the first connector mount. The first electrical connector has a first connector housing holding first contacts in a contact array. The first connector housing has a mating end and a cable end. The first electrical connector has cables terminated to the first contacts and extending from the cable end. The first connector housing has a first mounting feature. The first connector mount has a first bracket coupled to a mounting surface of the first circuit board proximate to the mating edge. The first connector mount has a first biasing member coupled to the first bracket and coupled to the first mounting feature of the first electrical connector. The first biasing member is compressible along a compression axis to allow the first electrical connector to float relative to the first circuit board. The communication system includes a second circuit board assembly including a second circuit board and a second electrical connector coupled to the second circuit board. The second electrical connector has a second connector housing holding second contacts in a contact array. The second connector housing has a mating end coupled to the mating end of the first connector housing along a mating axis. The first biasing member is compressible between the first bracket and the first connector housing to allow the first electrical connector to float relative to the first circuit board along the mating axis.

In a further embodiment, a communication system is provided and includes an equipment rack having frame members. The equipment rack includes a front chamber and a rear chamber. The equipment rack has a front guide element at the front chamber and a rear guide element at the rear chamber. The communication system includes a first circuit board assembly that is plugged into the front chamber. The communication system includes a second circuit board assembly that is plugged into the rear chamber to mate with the first circuit board assembly in a mating direction. The communication system includes a first circuit board assembly including a first circuit board, a first connector mount coupled to the first circuit board, and a first electrical connector coupled to the first connector mount. The first circuit board is guided into the front chamber by the front guide element. The first electrical connector has a first connector housing holding first contacts in a contact array. The first connector housing has a mating end and a cable end. The first electrical connector has cables terminated to the first contacts and extending from the cable end. The first connector housing has a first mounting feature. The first connector mount has a first bracket coupled to a mounting surface of the first circuit board proximate to the mating edge. The first connector mount has a first biasing member coupled to the first bracket and coupled to the first mounting feature of the first electrical connector. The first biasing member is compressible along a compression axis to allow the first electrical connector to float relative to the first circuit board. The communication system includes a second circuit board assembly including a second circuit board and a second electrical connector coupled to the second circuit board. The second circuit board is guided into the rear chamber by the rear guide element. The second electrical connector has a second connector housing holding second contacts in a contact array. The second connector housing has a mating end coupled to the mating end of the first connector housing along a mating axis. The first biasing member is compressible between the first bracket and the first connector housing to allow the first electrical connector to float relative to the first circuit board along the mating axis.

DETAILED DESCRIPTION OF THE INVENTION

Figure 1:
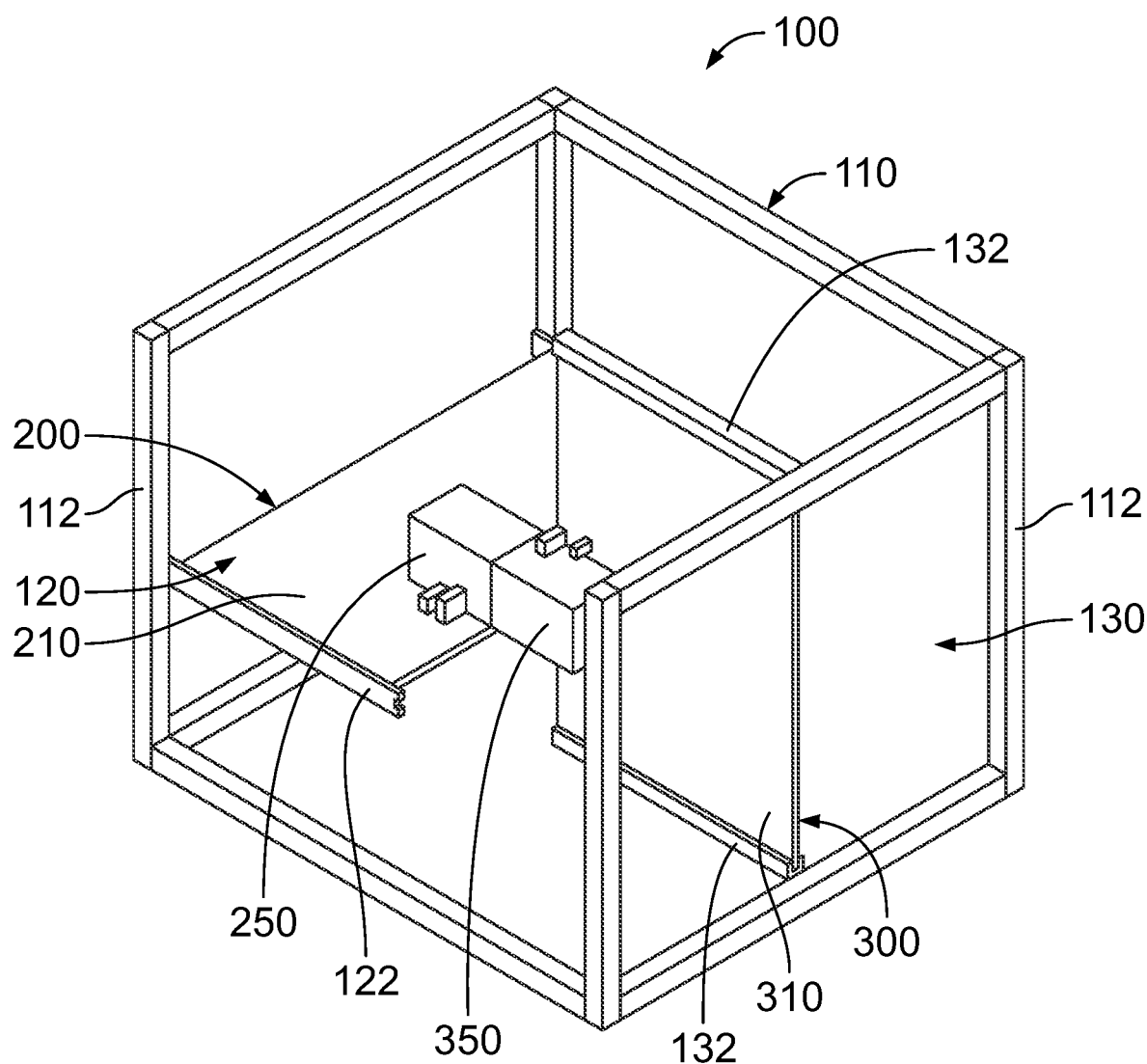
FIG. 1 is a schematic view of a communication system in accordance with an exemplary embodiment.

FIG. 1 is a schematic view of a communication system 100 in accordance with an exemplary embodiment. The communication system 100 includes a first circuit board assembly 200 and a second circuit board assembly 300 electrically coupled together. In various embodiments, the communication system 100 may be a server or network switch. In other various embodiments, the communication system 100 may be a backplane system. The first circuit board assembly 200 and/or the second circuit board assembly 300 may be a backplane assembly. The first circuit board assembly 200 and/or the second circuit board assembly 300 may be a daughtercard assembly. The first circuit board assembly 200 and/or the second circuit board assembly 300 may be a motherboard assembly.

In an exemplary embodiment, the first circuit board assembly 200 and/or the second circuit board assembly 300 includes a compressible mating interface to take up mating tolerance for the communication system 100. For example, the first circuit board assembly 200 and/or the second circuit board assembly 300 may include a spring loaded connector configured to be compressed in the mating direction.

In an exemplary embodiment, the communication system 100 includes an equipment rack 110 used to hold the first circuit board assembly 200 and/or the second circuit board assembly 300. The equipment rack 110 includes frame members 112 forming one or more chambers for the first circuit board assembly 200 and/or the second circuit board assembly 300. In the illustrated embodiment, the equipment rack 110 includes a front chamber 120 configured to receive the first circuit board assembly 200 and a rear chamber 130 configured to receive the second circuit board assembly 300. Optionally, multiple circuit board assemblies may be received in the front chamber 120 and/or the rear chamber 130. The equipment rack 110 may be open at the front and/or the rear and/or the sides. Alternatively, the equipment rack 110 may include walls or panels (not shown) that close the chambers 120, 130 at the front and/or the rear and/or the sides. The equipment rack 110 may include horizontally oriented trays or platforms that divide the chambers 120, 130 into stacked sub-chambers each receiving a corresponding circuit board assembly. The equipment rack 110 may include vertically oriented divider walls that divide the chambers 120, 130 into adjacent sub-chambers each receive a corresponding circuit board assembly.

In an exemplary embodiment, the equipment rack 110 includes front guide elements 122 in the front chamber 120. The front guide elements 122 are used to guide the first circuit board assembly 200 into the front chamber 120. The front guide elements 122 may locate the first circuit board assembly 200 relative to the equipment rack 110, such as for mating with the second circuit board assembly 200. In an exemplary embodiment, the front guide elements 122 are rails or tracks having a slot or groove that receive the first circuit board assembly 200. Other types of guide elements may be used in alternative embodiments, such as tabs, pins, posts, openings, sockets, and the like.

In an exemplary embodiment, the equipment rack 110 includes rear guide elements 132 in the rear chamber 130. The rear guide elements 132 are used to guide the second circuit board assembly 300 into the rear chamber 130. The rear guide elements 132 may locate the second circuit board assembly 300 relative to the equipment rack 110, such as for mating with the first circuit board assembly 200. In an exemplary embodiment, the rear guide elements 132 are rails or tracks having a slot or groove that receive the second circuit board assembly 300. Other types of guide elements may be used in alternative embodiments, such as tabs, pins, posts, openings, sockets, and the like.

During assembly, the first circuit board assembly 200 is loaded into the front chamber 120 through the front end and the second circuit board assembly 300 is loaded into the rear chamber 130 through the rear end. The first and second circuit board assemblies 200, 300 are mated within the equipment rack 110, such as at the center of the equipment rack 110. The first and second circuit board assemblies 200, 300 slide into and out of the equipment rack 110, such as along the guide elements 122, 132. In the illustrated embodiment, the first and second circuit board assemblies 200, 300 are oriented perpendicular to each other. For example, the first circuit board assembly 200 is oriented vertically and the second circuit board assembly 300 is oriented horizontally, or vice versa. In other various embodiments, the first and second circuit board assemblies 200, 300 are oriented parallel to each other. For example, the first and second circuit board assemblies 200, 300 may both be oriented vertically. Alternatively, the first and second circuit board assemblies 200, 300 may both be oriented horizontally.

The first circuit board assembly 200 includes a first circuit board 210 and a first electrical connector 250 coupled to the first circuit board 210. The first electrical connector 250 is configured to be mated with the second circuit board assembly 300. Optionally, the first electrical connector 250 is a floating connector, wherein the first electrical connector 250 is movable relative to the first circuit board 210. The first electrical connector 250 may be moved when mated with the second circuit board assembly 300. For example, the first electrical connector 250 may have a compressible mating interface. Alternatively, the first electrical connector 250 may be a fixed connector, wherein the first electrical connector 250 is fixed relative to the first circuit board 210 and does not move relative to the first circuit board 210 when mated with the second circuit board assembly 300.

The second circuit board assembly 300 includes a second circuit board 310 and a second electrical connector 350 coupled to the second circuit board 310. The second electrical connector 350 is configured to be mated with the first electrical connector 250 of the first circuit board assembly 200. Optionally, the second electrical connector 350 may be a floating connector, wherein the second electrical connector 350 is movable relative to the second circuit board 310. The second electrical connector 350 may be moved when mated with the second circuit board assembly 300. For example, the second electrical connector 350 may have a compressible mating interface. Alternatively, the second electrical connector 350 may be a fixed connector, wherein the second electrical connector 350 is fixed relative to the second circuit board 310 and does not move relative to the second circuit board 310 when mated with the first electrical connector 250.

Figure 2:
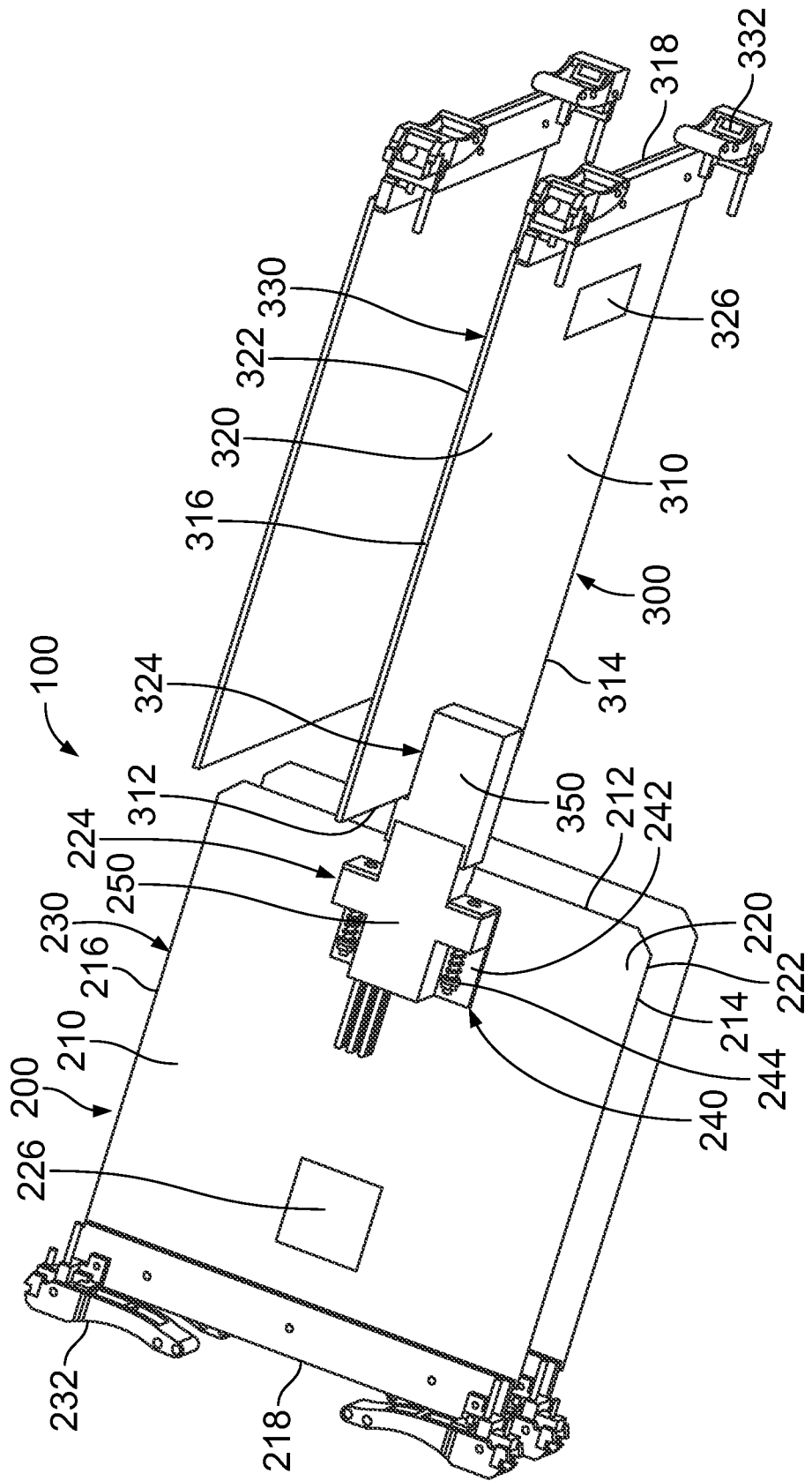
FIG. 2 is a top perspective view of the communication system in accordance with an exemplary embodiment.
Figure 3:
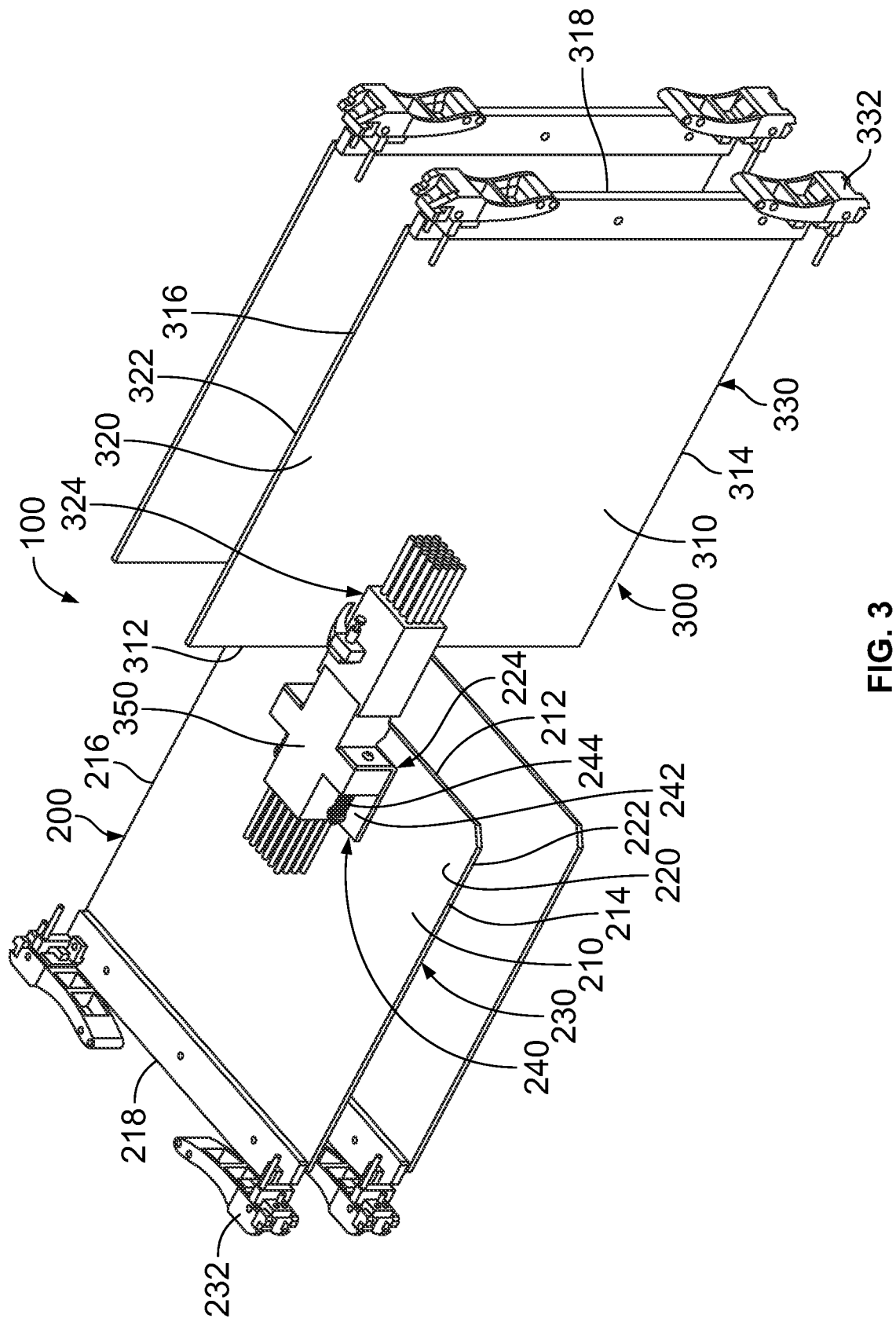
FIG. 3 is a rear perspective view of the communication system in accordance with an exemplary embodiment.

FIG. 2 is a top perspective view of the communication system 100 in accordance with an exemplary embodiment. FIG. 3 is a rear perspective view of the communication system 100 in accordance with an exemplary embodiment. FIG. 2 shows the first electrical connector 250 as a cable connector and the second electrical connector 350 as a board connector. The first electrical connector 250 is a floating connector and the second electrical connector 350 is a fixed connector. FIG. 3 shows the first electrical connector 250 as a cable connector and the second electrical connector 350 as a cable connector. The first electrical connector 250 is a floating connector and the second electrical connector 350 is a fixed connector. In alternative embodiments, the second electrical connector 350 may be a floating connector.

In the illustrated embodiments, the communication system 100 includes multiple front circuit board assemblies 200 and multiple rear circuit board assemblies 300; however, the communication system 100 may include a single front circuit board assembly 200 and/or a single rear circuit board assembly 300. In the illustrated embodiment, the circuit board 210 has a single electrical connector 250 and the circuit board 310 has a single electrical connector 350; however, the circuit board 210 may include multiple electrical connectors 250 and/or the circuit board 310 may include multiple electrical connectors 350.

The first circuit board 210 includes a mating edge 212 at a front of the first circuit board 210 and side edges 214, 216 extending between the mating edge 212 and a rear edge 218. The first circuit board 210 is rectangular in the illustrated embodiment. The first circuit board 210 may have other shapes in alternative embodiments. The circuit board 210 includes first and second surfaces 220, 222 (for example, upper and lower surfaces). The first electrical connector 250 is mounted to the first surface 220 of the circuit board 210 at a mounting area 224. Optionally, the mounting area 224 may be located proximate to the mating edge 212. One or more electrical connectors may additionally or alternatively be located at the second surface 222.

In an exemplary embodiment, the first circuit board 210 includes one or more electrical components 226 coupled to the first circuit board 210. The electrical components 226 may be chips, integrated circuits, processors, memory modules, electrical connectors or other components. The electrical components 226 may be electrically connected to the circuit board 210, such as through traces, pads, vias or other circuits. In an exemplary embodiment, the electrical components 226 are electrically connected to the first electrical connector 250, such as through the first circuit board 210 or by direct connection through the cables.

The first circuit board 210 includes one or more board guide features 230 for locating the circuit board 210 in the equipment rack 110 (shown in FIG. 1). The board guide features 230 are configured to be coupled to the corresponding guide elements 122 (shown in FIG. 1). In the illustrated embodiment, the board guide features 230 are defined by the edges of the circuit board 210 along the sides 214, 216, which are configured to slide into grooves of the track defining the guide elements 122. Other types of guide features may be used in alternative embodiments, such as rails, slots tabs, pins, and the like.

In an exemplary embodiment, the first circuit board assembly 200 includes latching features 232 at the rear end 218. The latching features 232 are used to secure the first circuit board assembly 200 to the equipment rack 110. The latching features 232 may be used to press the circuit board 210 forward (toward the second circuit board 310) during mating or may be used to pull the circuit board 210 rearward during unmating.

In an exemplary embodiment, the first circuit board assembly 200 includes a first connector mount 240. The first connector mount 240 includes a bracket 242 and one or more biasing members 244 coupled to the bracket 242 and the electrical connector 250. The biasing members 244 forward bias the electrical connector 250 for mating with the second electrical connector 350. In an exemplary embodiment, the biasing members 244 are springs, such as coil springs. Other types of biasing members may be used in alternative embodiments, such as compressible foam members. The biasing members 244 allow the electrical connector 250 to move relative to the circuit board 210, such as during mating with the second electrical connector 350. The biasing members 244 provide compressive forces for maintaining mechanical and electrical connection between the first and second electrical connectors 250, 350. The biasing members 244 accommodate the mating tolerances between the circuit board assemblies 200, 300 within the equipment rack 110. For example, the circuit board 210 may have a positional range within the equipment rack 110 (for example, position of the mating edge 212 within the equipment rack 110 may vary by approximately 1.5 mm). The biasing members 244 may accommodate some or all of the mating dimensional tolerance distance (for example, approximately 1.5 mm) of the circuit board 210 in the equipment rack 110.

The second circuit board 310 includes a mating edge 312 at a front of the second circuit board 310 and side edges 314, 316 extending between the mating edge 312 and a rear edge 318. The mating edge 312 faces the mating edge 212 of the first circuit board 210. The circuit board 310 includes first and second surfaces 320, 322 (for example, left side and right side). The second electrical connector 350 is mounted to the first surface 320 of the circuit board 310 at a mounting area 324. Optionally, the mounting area 324 may be located proximate to the mating edge 312. One or more electrical connectors may additionally or alternatively be located at the second surface 322.

In an exemplary embodiment, the second circuit board 310 includes one or more electrical components 326 coupled to the second circuit board 310. The electrical components 326 may be chips, integrated circuits, processors, memory modules, electrical connectors or other components. The electrical components 326 may be electrically connected to the circuit board 310, such as through traces, pads, vias or other circuits. In an exemplary embodiment, the electrical components 326 are electrically connected to the second electrical connector 350, such as through the second circuit board 310 or by direct connection through cables.

The second circuit board 310 includes one or more board guide features 330 for locating the circuit board 310 in the equipment rack 110 (shown in FIG. 1). The board guide features 330 are configured to be coupled to the corresponding guide elements 132 (shown in FIG. 1). In the illustrated embodiment, the board guide features 330 are defined by the edges of the circuit board 310 along the sides 314, 316, which are configured to slide into grooves of the track defining the guide elements 132. Other types of guide features may be used in alternative embodiments, such as rails, slots tabs, pins, and the like.

In an exemplary embodiment, the second circuit board assembly 300 includes latching features 332 at the rear end 318. The latching features 332 are used to secure the second circuit board assembly 300 to the equipment rack 110. The latching features 332 may be used to press the circuit board 310 forward (toward the first circuit board 210) during mating or may be used to pull the circuit board 310 rearward during unmating.

Figure 4:
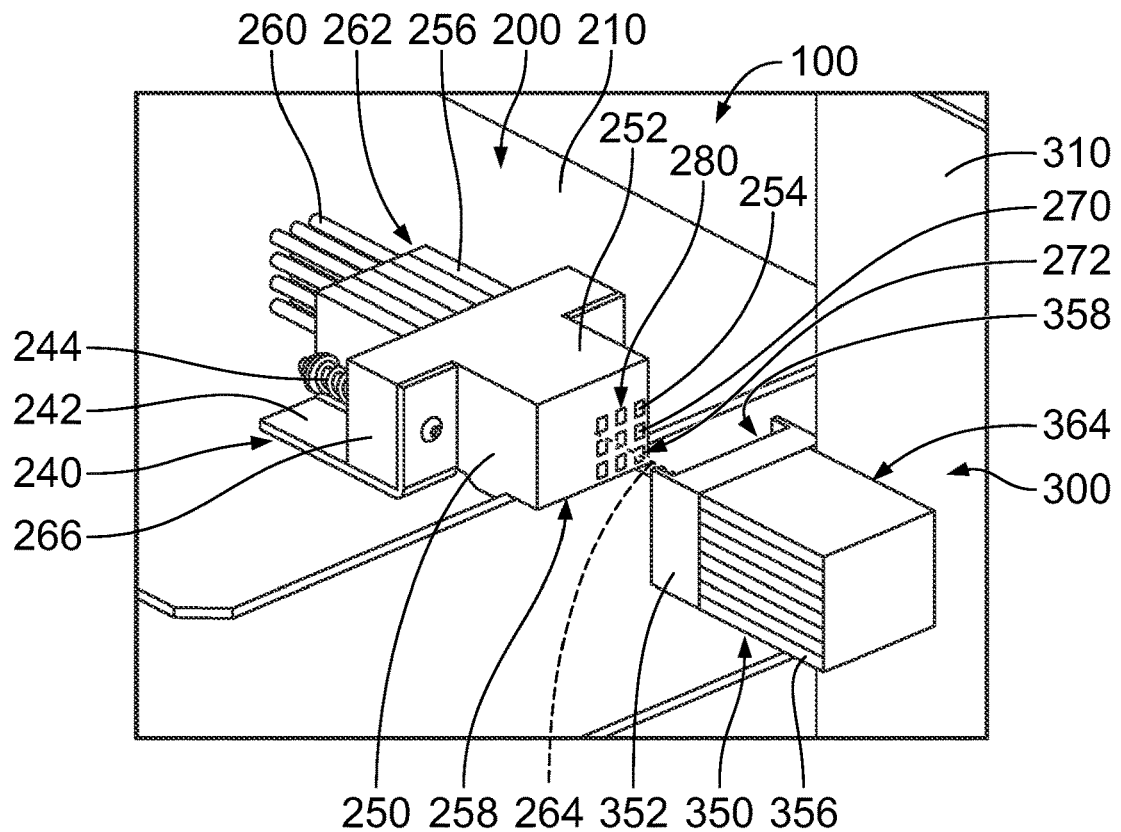
FIG. 4 is a perspective view of a portion of the communication system showing the mating interface of the first circuit board assembly in accordance with an exemplary embodiment.
Figure 5:
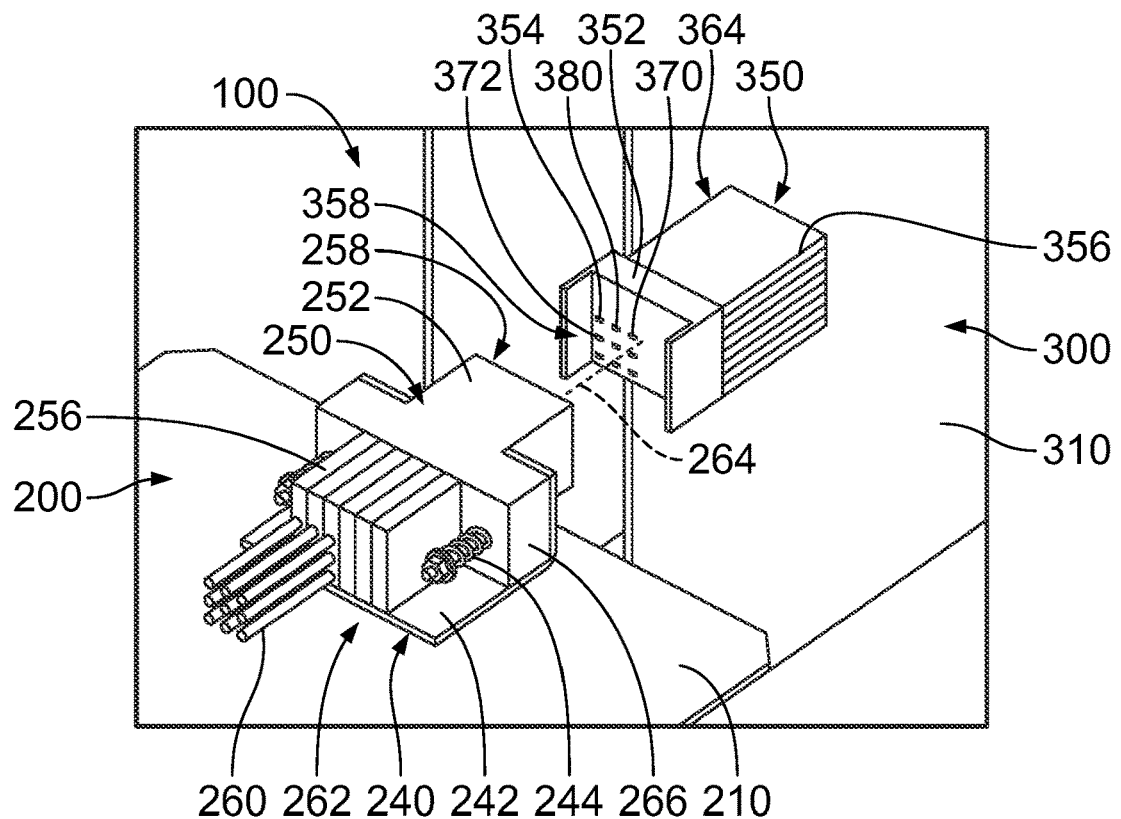
FIG. 5 is a perspective view of a portion of the communication system showing the mating interface of the second circuit board assembly in accordance with an exemplary embodiment.

FIG. 4 is a perspective view of a portion of the communication system 100 showing the mating interface of the first circuit board assembly 200 in accordance with an exemplary embodiment. FIG. 5 is a perspective view of a portion of the communication system 100 showing the mating interface of the second circuit board assembly 300 in accordance with an exemplary embodiment. The first circuit board assembly 200 has a compressible mating interface in the illustrated embodiment (for example, the first electrical connector 250 is movable relative to the first circuit board 210). The second circuit board assembly 300 has a fixed mating interface in the illustrated embodiment (for example, the second electrical connector 350 is fixed relative to the second circuit board 310).

The first electrical connector 250 includes a connector housing 252 holding first contacts 254 (FIG. 4) in a contact array. In various embodiments, the contacts 254 may be arranged together in first contact modules 256, also known as chicklets, which may be overmolded leadframes. The connector housing 252 includes a mating end 258 configured to be mated with the second electrical connector 350. The mating end 258 is at the front of the connector housing 252. The contacts 254 are exposed at the mating end 258 for mating with corresponding contacts of the second electrical connector 350.

In the illustrated embodiment, the first electrical connector 250 is a cable connector having a plurality of first cables 260 extending from the connector housing 252. The connector housing 252 includes a cable end 262. The cables 260 extend from the cable end 262. In the illustrated embodiment, the cable end 262 is opposite the mating end 258; however, other orientations are possible in alternative embodiments, such as being a right angle connector with the cable end 262 perpendicular to the mating end 258. The cables 260 may be individual cables 260, such as coaxial cables or twin axial cables. In other embodiments, the cables 260 may be flat, flexible cables, such as flex circuits. The cables 260 are electrically connected to corresponding contacts 254. The cables 260 are flexible to allow movement of the first electrical connector 250 relative to the first circuit board 210.

The first electrical connector 250 is configured to be mated with the second electrical connector 350 in a mating direction (along a mating axis 264). The mating end 258 may be perpendicular to the mating axis 264. In an exemplary embodiment, the first electrical connector 250 is movable in a direction parallel to the mating axis 264. For example, the first electrical connector 250 may be pressed rearward during mating.

In an exemplary embodiment, the connector housing 252 includes one or more mounting features 266. The mounting features 266 may be tabs or ears extending from one or more sides of the connector housing 252. The mounting features 266 may be coupled to the connector mount 240, such as to the bracket 242. In an exemplary embodiment, the biasing members 244 are coupled to the mounting features 266. The biasing members 244 may press the mounting features 266 forward against the bracket 242. The bracket 242 operates as a forward stop for the connector housing 252. The bracket 242 positions the first electrical connector 250 for mating with the second electrical connector 350.

The contacts 254 are provided at the mating end 258 for mating with the second electrical connector 350. In an exemplary embodiment, the contacts 254 are stamped and formed contacts. The contacts 254 have a metal body 270 (FIG. 4) extending between a mating end 272 and a terminating end (not shown) opposite the mating end 272. In an exemplary embodiment, conductors of the cables 260 are terminated to the terminating end of the corresponding contacts 254. For example, the terminating end may include a solder pad, a crimp barrel, an insulation displacement termination, or another type of electrical termination. In alternative embodiments, rather than being terminated to the cables 260, the terminating ends of the contacts 254 may be terminated directly to the circuit board 210, such as being soldered or press fit into plated vias of the circuit board 210. In such embodiment, the first electrical connector 250 may be fixed relative to the circuit board 210.

The mating end 272 of each contact 254 includes a mating interface configured to be electrically connected to the corresponding contact of the second electrical connector 350. In the illustrated embodiment, the mating ends 272 include flat pads 280. Other contact types can be used in alternative embodiments, such as spring beams, pins, sockets, and the like. In an exemplary embodiment, the mating end 272 has a short electrical length downstream of the mating interface, leading to a short electrical stub. Because the first electrical connector 250 is able to float relative to the first circuit board 210, the mating ends 272 of the contacts 254 are very short as the mating ends 272 do not need to accommodate the tolerance of the circuit board mating as such tolerance is accommodated by the spring loaded, floating movement of the electrical connector 250 (for example, as provided by the biasing members 244). The length of the stub at the mating end 272 may be short enough to just accommodate mechanical mating plus any contact wipe, but does not need to accommodate any circuit board mating tolerance.

The second electrical connector 350 includes a connector housing 352 holding second contacts 354 (FIG. 5) in a contact array. In various embodiments, the contacts 354 may be arranged together in second contact modules 356, also known as chicklets, which may be overmolded leadframes. The connector housing 352 includes a mating end 358 configured to be mated with the first electrical connector 250. The mating end 358 is at the front of the connector housing 352 (facing the mating end 258 of the first electrical connector 250). The second contacts 354 are exposed at the mating end 358 for mating with the first contacts 254.

In the illustrated embodiment, the second electrical connector 350 is a board connector configured to be mounted directly to the second circuit board 310. The connector housing 352 includes a mounting end 364 mounted to the second circuit board 310. In the illustrated embodiment, the second electrical connector 350 is a right-angle connector having the mounting end 364 perpendicular to the mating end 358; however, other orientations are possible in alternative embodiments. The connector housing 352 may include mounting features for mounting the connector housing 352 to the circuit board 310, such as mounting lugs that receive threaded fasteners, press tabs, solder tabs, and the like. Alternatively, the contacts 354 may be used to mount the second electrical connector 350 to the circuit board 310, such as using press fit pins.

The second electrical connector 350 is configured to be mated with the first electrical connector 250 in the mating direction along the mating axis 264. The first electrical connector 350 may be pressed rearward during mating as the second circuit board assembly 300 is loaded into the equipment rack 110. The movement of the first electrical connector 350 allows the contacts 254, 354 to be relatively short as the contacts 254, 354 do not need to accommodate for the circuit board mating tolerance, which may be approximately 1.5 mm, meaning that the first contacts 254 and/or the second contacts 354 may be shortened, such as by approximately 1.5 mm compared to other systems.

The contacts 354 are provided at the mating end 358 for mating with the second electrical connector 350. In an exemplary embodiment, the contacts 354 are stamped and formed contacts. The contacts 354 have a metal body 370 extending between a mating end 372 and a terminating end (not shown) opposite the mating end 372. In an exemplary embodiment, the terminating ends of the contacts 354 may be terminated directly to the circuit board 310, such as being soldered or press fit into plated vias of the circuit board 310. Alternatively, the contacts 354 may be terminated to cables rather than directly to the circuit board 310.

The mating end 372 of each second contact 354 includes a mating interface configured to be electrically connected to the first contact 254. In the illustrated embodiment, the mating ends 372 include spring beams 380. Other contact types can be used in alternative embodiments, such as pads, pins, sockets, and the like. In an exemplary embodiment, the mating end 372 has a short electrical length downstream of the mating interface, leading to a short electrical stub. Because the first electrical connector 250 is able to float (press rearward) when mated with the second electrical connector 350, the mating ends 372 of the contacts 354 are very short as the mating ends 372 do not need to accommodate the tolerance of the circuit board mating as such tolerance is accommodated by the spring loaded, floating movement of the first electrical connector 250. The length of the stub at the mating end 372 may be short enough to just accommodate mechanical mating plus any contact wipe, but does not need to accommodate any circuit board mating tolerance.

The floating mounting system provided by the connector mount 240 and the biasing members 244 for the first electrical connector 250 (and similarly may be provided for the second electrical connector 350) absorbs the circuit board mating tolerance (for example, absorbs 1.5 mm mating tolerance or more). The floating mounting system eliminates the need for the contact interface to be able to absorb the large rack mating tolerances allowing shorting contacts. The stubs at the ends of the contacts 254 and/or 354 may be shortened (for example, less than 1.0 mm), which improves the performance of the communication system 100 by improving the signal integrity along the signal paths. The performance, particularly at high speeds (for example, above 100 Gbps and more particularly, above 200 Gbps) is improved compared to contacts having long electrical stubs.

Figure 6:
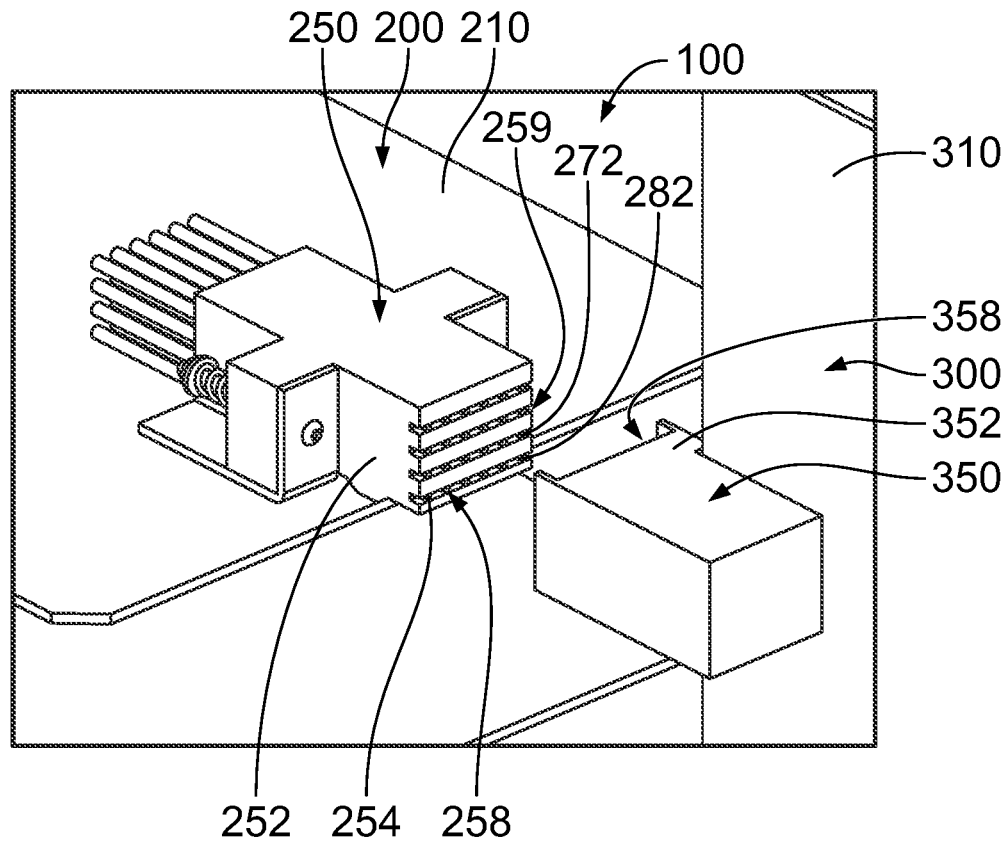
FIG. 6 is a perspective view of a portion of the communication system showing the mating interface of the first circuit board assembly in accordance with an exemplary embodiment.
Figure 7:
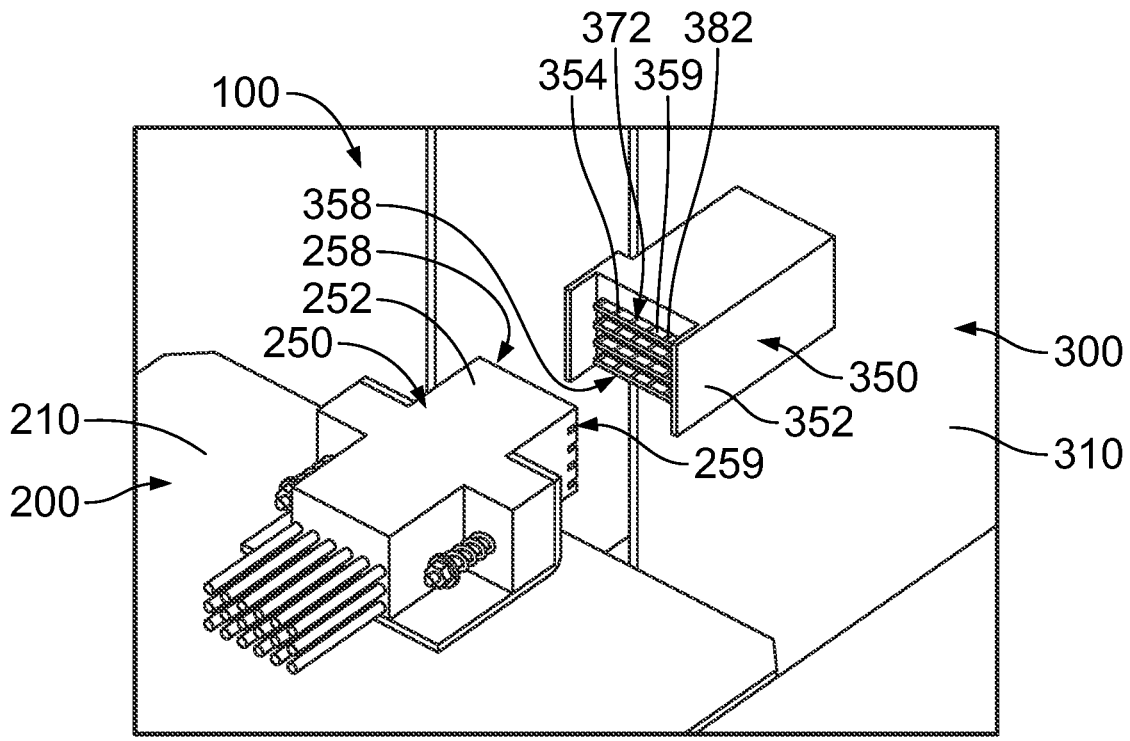
FIG. 7 is a perspective view of a portion of the communication system showing the mating interface of the second circuit board assembly in accordance with an exemplary embodiment.

FIG. 6 is a perspective view of a portion of the communication system 100 showing the mating interface of the first circuit board assembly 200 in accordance with an exemplary embodiment. FIG. 7 is a perspective view of a portion of the communication system 100 showing the mating interface of the second circuit board assembly 300 in accordance with an exemplary embodiment. The first circuit board assembly 200 has a different mating interface compared to the mating interface shown in FIG. 4. The second circuit board assembly 300 has a different mating interface compared to the mating interface shown in FIG. 5. In the illustrated embodiment, the first circuit board assembly 200 is a floating connector, while the second circuit board assembly 300 is a fixed connector; however, the second circuit board assembly 300 may alternatively or additionally be a floating connector.

The first contacts 254 (FIG. 6) are exposed at the mating end 258 of the connector housing 252 for mating with the second contacts 354 of the second electrical connector 350. In an exemplary embodiment, the contacts 254 are stamped and formed contacts. The contacts 254 have a different type of mating interface at the mating ends 272 compared to the embodiment of FIG. 4. In an exemplary embodiment, the connector housing 252 includes slots 259 at the mating end 258, such as card slots. The mating ends 272 of the contacts 254 are arranged in the slots 259 for mating with the second electrical connector 350. The contacts 254 may be arranged on both sides of the slots 259, such as above and below the slots 259 to interface with the corresponding second contacts 354. In an exemplary embodiment, the mating ends 272 include deflectable spring beams 282. Other contact types can be used in alternative embodiments, such as pads, pins, sockets, and the like. In an exemplary embodiment, the mating end 272 has a short electrical length downstream of the mating interface (for example, the curved end forming a stub beyond the mating interface), leading to a short electrical stub. Because the first electrical connector 250 is able to float relative to the first circuit board 210, the mating ends 272 of the contacts 254 are very short as the mating ends 272 do not need to accommodate the tolerance of the circuit board mating. The length of the stub at the mating end 272 may be short enough to just accommodate mechanical mating plus any contact wipe, but does not need to accommodate any circuit board mating tolerance.

The second contacts 354 (FIG. 7) are exposed at the mating end 358 of the connector housing 352 for mating with the first contacts 254. In an exemplary embodiment, the contacts 354 are stamped and formed contacts. Alternatively, the contacts 354 may be printed circuits, such as on a circuit card. The contacts 354 have a different type of mating interface at the mating ends 372 compared to the embodiment shown in FIG. 5. In an exemplary embodiment, the connector housing 352 includes trays 359 at the mating end 358, which may be formed integral with the connector housing 352 or may be separate pieces plugged into the connector housing 352 (for example, circuit cards). The mating ends 372 of the contacts 354 extend along the surfaces of the trays 359, such as at the edges of the trays 359. The contacts 354 may be arranged on both sides of the trays 359. In an exemplary embodiment, the mating ends 372 include pads 382. Other contact types can be used in alternative embodiments, such as deflectable spring beams, pins, sockets, and the like. In an exemplary embodiment, the mating end 372 has a short electrical length downstream of the mating interface, leading to a short electrical stub.

Figure 8:
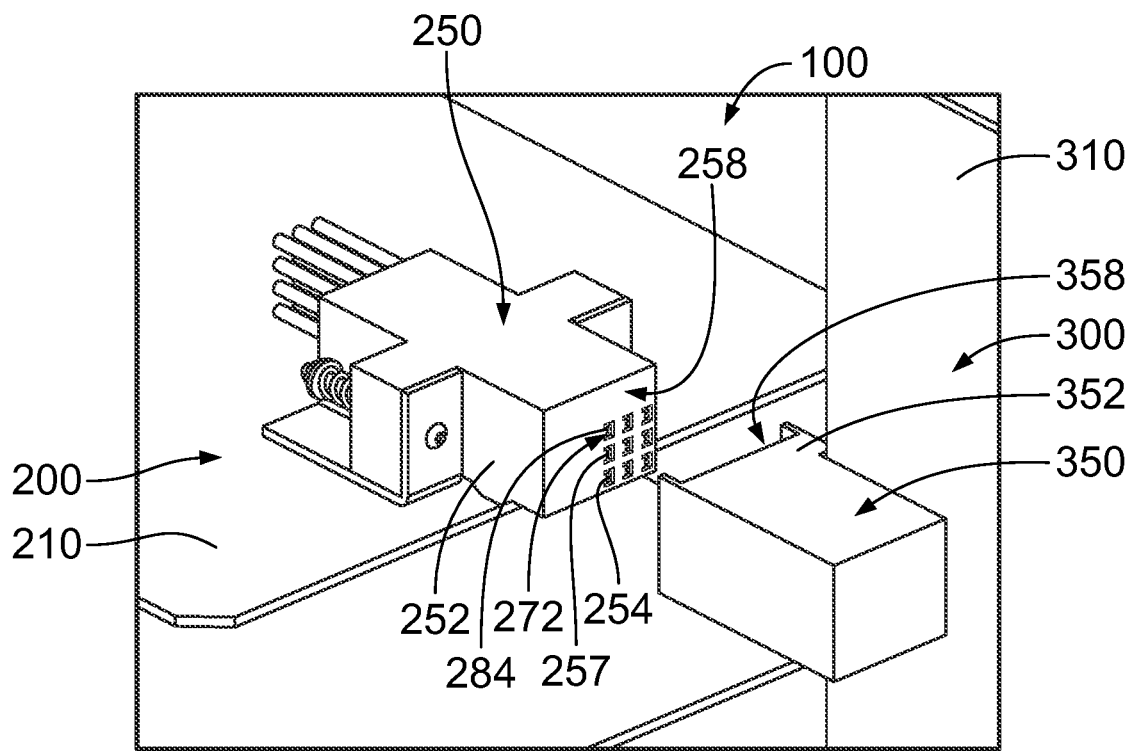
FIG. 8 is a perspective view of a portion of the communication system showing the mating interface of the first circuit board assembly in accordance with an exemplary embodiment.
Figure 9:
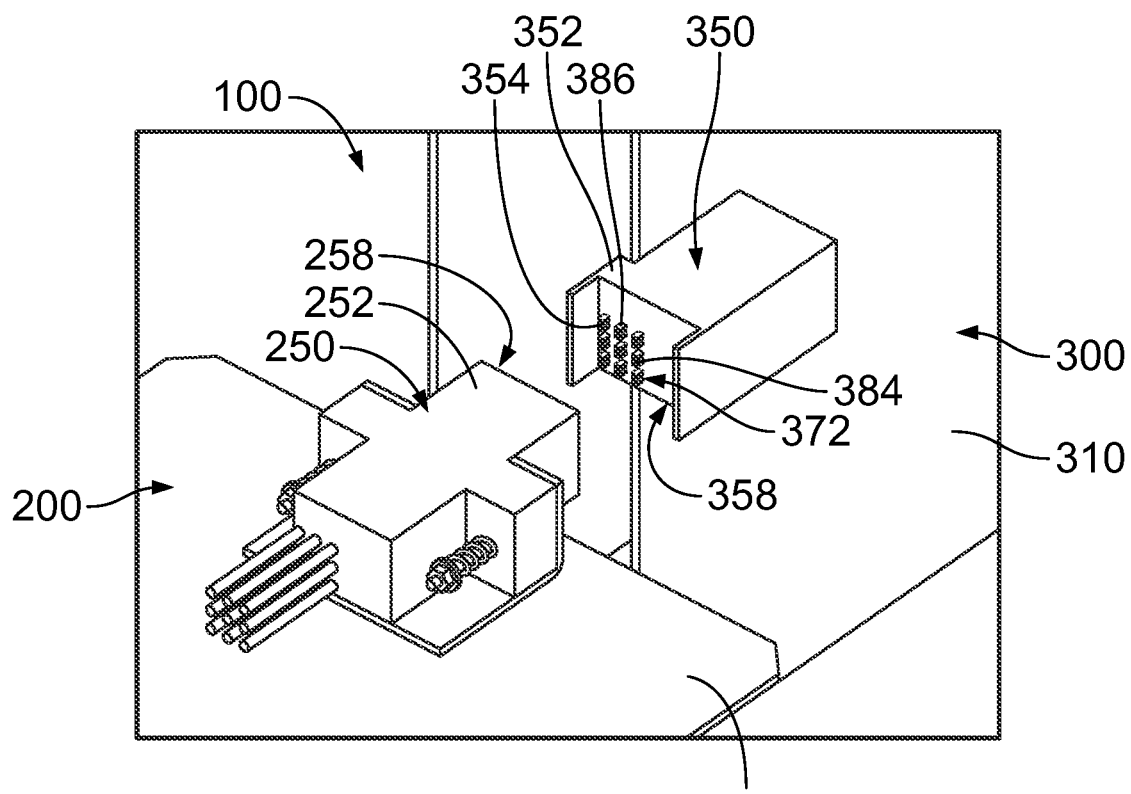
FIG. 9 is a perspective view of a portion of the communication system showing the mating interface of the second circuit board assembly in accordance with an exemplary embodiment.

FIG. 8 is a perspective view of a portion of the communication system 100 showing the mating interface of the first circuit board assembly 200 in accordance with an exemplary embodiment. FIG. 9 is a perspective view of a portion of the communication system 100 showing the mating interface of the second circuit board assembly 300 in accordance with an exemplary embodiment. The first circuit board assembly 200 has a different mating interface compared to the mating interfaces shown in FIGS. 4 and 6. The second circuit board assembly 300 has a different mating interface compared to the mating interfaces shown in FIGS. 5 and 7. In the illustrated embodiment, the first circuit board assembly 200 is a floating connector, while the second circuit board assembly 300 is a fixed connector; however, the second circuit board assembly 300 may alternatively or additionally be a floating connector.

The first contacts 254 (FIG. 8) are exposed at the mating end 258 of the connector housing 252 for mating with the second contacts 354 of the second electrical connector 350. In an exemplary embodiment, the contacts 254 are stamped and formed contacts. The contacts 254 have a different type of mating interface at the mating ends 272 compared to the embodiments of FIGS. 4 and 6. In an exemplary embodiment, the connector housing 252 includes contact channels 257 at the mating end 258, including both signal channels and ground channels. The ground channels hold ground contacts or ground shields, which provide electrical shielding for the contacts 254. In the illustrated embodiment, the ground channels are C-shaped. The mating ends 272 of the contacts 254 are arranged in the contact channels for mating with the second electrical connector 350. In an exemplary embodiment, the mating ends 272 include sockets 284 (such as split beam contacts). Other contact types can be used in alternative embodiments. In an exemplary embodiment, the mating end 272 has a short electrical length downstream of the mating interface (for example, the curved ends of the beams forming stubs beyond the mating interfaces), leading to a short electrical stub. Because the first electrical connector 250 is able to float relative to the first circuit board 210, the mating ends 272 of the contacts 254 are very short as the mating ends 272 do not need to accommodate the tolerance of the circuit board mating. The length of the stub at the mating end 272 may be short enough to just accommodate mechanical mating plus any contact wipe, but does not need to accommodate any circuit board mating tolerance.

The second contacts 354 (FIG. 9) are exposed at the mating end 358 of the connector housing 352 for mating with the first contacts 254. In an exemplary embodiment, the contacts 354 are stamped and formed contacts. The contacts 354 have a different type of mating interface at the mating ends 372 compared to the embodiments shown in FIGS. 5 and 7. The mating ends 372 of the contacts 354 include pins 384, which may be arranged in pairs. Other contact types can be used in alternative embodiments. In an exemplary embodiment, the second electrical connector 350 includes ground shields 386 providing electrical shielding for the pins 384. The ground shields 386 are C-shaped in the illustrated embodiment. In an exemplary embodiment, the mating end 372 has a short electrical length downstream of the mating interface, leading to a short electrical stub.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
an equipment rack having frame members, the equipment rack including a chamber, the equipment rack having guide elements at the chamber;
a circuit board assemblies plugged into the chamber, the circuit board assemblies positioned in the chamber relative to the equipment rack by the guide elements;
each circuit board assembly including a circuit board, a connector mount coupled to the circuit board, and an electrical connector coupled to the connector mount, the circuit board being guided into the chamber by the corresponding guide element, the electrical connector having a connector housing holding contacts in a contact array, the connector housing having a mating end and a cable end, the electrical connector having cables terminated to the contacts and extending from the cable end, the electrical connector includes ground shields at the mating end providing electrical shielding for the contacts, the ground shields configured to be electrically connected to the mating electrical connector, the connector housing having a mounting feature, the connector mount having a bracket coupled to a mounting surface of the circuit board proximate to a mating edge, the connector mount having a biasing member coupled to the bracket and coupled to the mounting feature of the electrical connector, the biasing member being compressible along a compression axis to allow the electrical connector to float relative to the circuit board;

wherein the biasing members allow the electrical connectors to move relative to the corresponding circuit board independent of each other for mating with mating components plugged into the equipment rack.

2. The circuit board assembly of claim 1, wherein the circuit boards of the circuit board assemblies are parallel to each other.

3. The circuit board assembly of claim 1, wherein the electrical connector is movable relative to the circuit board during mating with a mating electrical connector.

4. The circuit board assembly of claim 1, wherein the compression axis is parallel to the mounting surface of the circuit board.

5. The circuit board assembly of claim 1, wherein the connector mount includes a board mount and a housing mount extending from the board mount, the board mount being fixed to the circuit board, the connector housing being coupled to the housing mount via the biasing member, the biasing member connected between the connector housing and the housing mount, the connector housing being movable relative to the housing mount.

6. The circuit board assembly of claim 1, wherein the biasing member is a first biasing member, the connector mount including a second biasing member connected between the bracket and the connector housing.

7. The circuit board assembly of claim 1, wherein the cables are electrically connected to the circuit board at a remote location from the connector mount.

8. The circuit board assembly of claim 1, wherein the circuit board includes an electrical component coupled to the circuit board remote from the mating edge, the cables being electrically connected to the electrical component.

9. The circuit board assembly of claim 1, wherein the contacts include mating ends at the mating end of the connector housing, the mating ends having very short electrical stubs.

10. The circuit board assembly of claim 1, wherein the contacts include mating ends at the mating end of the connector housing, the mating ends having electrical stubs shorter than a dimensional tolerance distance of the circuit board in the equipment rack.

11. The circuit board assembly of claim 1, wherein the contacts include mating ends at the mating end of the connector housing, the mating ends having electrical stubs shorter than 1.0 mm.

12. A circuit board assembly comprising:
a circuit board having a mounting surface, the circuit board having a mating edge and side edges extending from the mating edge to a rear edge, the circuit board having a board guide feature for locating the circuit board in an equipment rack;

an electrical connector having a connector housing holding contacts in a contact array, the connector housing having a mating end and a cable end, the mating end configured to be mated with a mating electrical connector in a mating direction, the electrical connector having cables terminated to the contacts and extending from the cable end, the connector housing having a mounting feature, wherein the contacts include mating ends at the mating end of the connector housing, the mating ends having electrical stubs shorter than a dimensional tolerance distance of the circuit board in the equipment rack, wherein the electrical connector includes ground shields at the mating end providing electrical shielding for the contacts, the ground shields configured to be electrically connected to the mating electrical connector; and a connector mount for locating the electrical connector relative to the circuit board, the connector mount having a bracket coupled to the mounting surface of the circuit board proximate to the mating edge, the connector mount having a biasing member coupled to the bracket and coupled to the mounting feature of the electrical connector, the biasing member being compressible along a compression axis parallel to the mating direction to allow the electrical connector to float in the mating direction relative to the circuit board, the connector mount allowing the electrical connector to move relative to the circuit board during mating with the mating electrical connector.

13. The circuit board assembly of claim 12, wherein the compression axis is parallel to the mounting surface of the circuit board.

14. The circuit board assembly of claim 12, wherein the connector mount includes a board mount and a housing mount extending from the board mount, the board mount being fixed to the circuit board, the connector housing being coupled to the housing mount via the biasing member, the biasing member connected between the connector housing and the housing mount, the connector housing being movable relative to the housing mount.

15. The circuit board assembly of claim 12, wherein the cables are electrically connected to the circuit board at a remote location from the connector mount.

16. The circuit board assembly of claim 12, wherein the circuit board includes an electrical component coupled to the circuit board remote from the mating edge, the cables being electrically connected to the electrical component.

17. The circuit board assembly of claim 12, wherein the mating ends having electrical stubs shorter than 1.0 mm.

* * * * *